United States Patent [19]

Nelson et al.

[11] 4,408,175
[45] Oct. 4, 1983

[54] SELF CENTERING CURRENT RESPONSIVE PICKUP MEANS

[75] Inventors: Marvin D. Nelson, St. Louis Park; B. Hubert Pinckaers, Edina, both of Minn.

[73] Assignee: Honeywell Inc., Minneapolis, Minn.

[21] Appl. No.: 340,416

[22] Filed: Jan. 18, 1982

[51] Int. Cl.³ ............................................. H01F 27/02
[52] U.S. Cl. ........................................ 336/92; 174/92; 324/127; 336/173
[58] Field of Search .................... 324/127; 174/138 F, 174/92; 336/90, 92, 173, 174, 175, 176

[56] References Cited

U.S. PATENT DOCUMENTS

| | | | |
|---|---|---|---|
| 2,165,290 | 7/1939 | Mitchell | 324/127 |
| 2,709,800 | 5/1955 | Temple et al. | 324/127 X |
| 3,056,922 | 10/1962 | DuVall et al. | 324/127 X |
| 3,471,784 | 10/1969 | Arndt et al. | 324/127 |
| 3,518,544 | 6/1970 | Tachick | 324/127 |
| 3,657,650 | 4/1972 | Arndt | 324/127 X |
| 3,701,003 | 10/1972 | Anderson | 324/127 X |
| 3,846,725 | 11/1974 | Mears, Jr. | 336/92 |
| 3,895,296 | 7/1975 | Boyd et al. | 324/127 X |
| 4,240,072 | 12/1980 | Fowler | 324/127 X |

*Primary Examiner*—Thomas J. Kozma
*Attorney, Agent, or Firm*—Alfred N. Feldman

[57] ABSTRACT

A molded plastic housing mounts a coil adjacent to a conductor to act as a current responsive pickup means. The mounting arrangement for the pickup coil uses no magnetic circuit and is adapted to self-center the structure on conductors of varying sizes without the need to sever and reconnect the current carrying conductor. The pickup means provide a substantially linear output voltage from the pickup coil versus the current being carried in the monitored conductor.

10 Claims, 2 Drawing Figures

SELF CENTERING CURRENT RESPONSIVE PICKUP MEANS

BACKGROUND OF THE INVENTION

The use of alternating current transformers as a pickup or sensing means to sense a current flow in a conductor has been recognized for many years. Typically, these devices utilize a magnetic circuit that can be opened and then closed around a conductor in order to link the magnetic field generated by the current flowing in a conductor. This linkage is then used to couple to a coil to generate a voltage that is representative of the amount of current being drawn through the conductor under investigation.

The prior art devices generally use a magnetic circuit that can be separated into two segments to encircle the conductor, and further have been used as a means of testing for current without continuously sensing its presence. When current transformers are designed to be used as a continuous sensing device they typically are manufactured to encircle a specific size of wire. That wire normally is embedded in the device, and the section of wire that is embedded in the device is normally then connected into the circuit to be monitored. These devices typically utilize a conventional magnetic circuit with the conductor segment that is built into the device being used as the transformer primary. These constructions are very expensive and inconvenient to use as current pickup devices.

SUMMARY OF THE INVENTION

The present invention is directed to a unique type of clamp-on, self-centering type of current transformer or pickup that can be placed around conductors without severing the conductor or interconnecting into the conductor's circuit. The device further is made totally of nonmagnetic materials so as to provide a minimum of cost, size, and weight in the sensing unit.

By designing a nonmagetic unit which can be encased in a plastic housing, it is possible to provide a molded housing that can be folded or wrapped around a conductor and clamped into position as a sensing or pickup means. The present invention further is directed to a device wherein the size of the conductor is accommodated by a pair of resilient guide means that have an H-shape so that the wire around which the device is enclosed is held centered by the resilient guide means. Since the guide means are resilient, the guide means can accommodate a number of different sizes of wire without any change in the device.

The present self-centering type of current transformer or pickup means can be fabricated almost entirely of nonmagnetic and inexpensive molded plastic parts. The only metal that need be contained in the device is the pickup coil itself and the terminals that connect to the coil for further interconnection to the measuring or sensing equipment. Once the device is folded to encircle a conductor, the coil is retained in position and the overall device is centered around the conductor. The device can be held together, by any convenient means, such as nonmagnetic stainless steel screws.

This structure has shown a remarkable linearity of alternating current voltage generated at the terminals of the pickup coil versus the alternating current in the conductor under measurement. This is due to the absence of the magnetic circuit—which causes non-linearities—used in prior art devices. Another advantage, in addition to improved linearity, is that, since there are no saturation effects, the dynamic range of measurement is much wider. These advantages allow for the use of this self-centering type of current transformer or pickup device as a sensing element in many types of energy detecting, monitoring, and control installations.

DESCRIPTION OF THE PREFERRED EMBODIMENT

Figure 1:
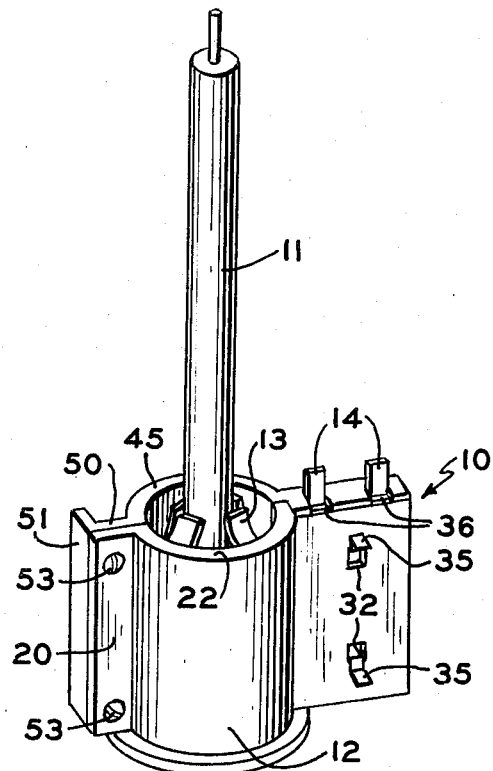
FIG. 1 is an assembled device encircling a conductor.

In FIG. 1 there is disclosed a pictorial view of a current responsive pickup means or self-centering type of current transformer housing means 10 attached to a conductor 11 that normally carries an alternating electric current that is to be monitored. The use of the term alternating current implies any type of voltage that has a rate of change that is capable of generating a changing magnetic field. It is not limited to a typical sinusoidal wave form. The pickup means 10 is formed of a nonmagnetic housing means 12 that utilizes a plurality of resilient guide means 13 that acts as a self-centering mechanism to position the housing means 12 around the conductor 11. Enclosed within the nonmagnetic housing means 12 is a magnetic pickup means (disclosed in FIG. 2) which has a pair of terminals 14 disclosed as projecting through a portion of the housing means 12. The terminals 14 allow for connection of the pickup means thereby providing it with a way of being adapted to be connected to a current measuring circuit (not shown). The pickup means within the housing means 12 is positioned in proximity to the conductor 11 and is air coupled to the magnetic field generated by a current being carried in the conductor 11. A device fabricated according to the present invention has been tested and shows a very linear coil voltage versus the current flow in the conductor 11.

Figure 2:
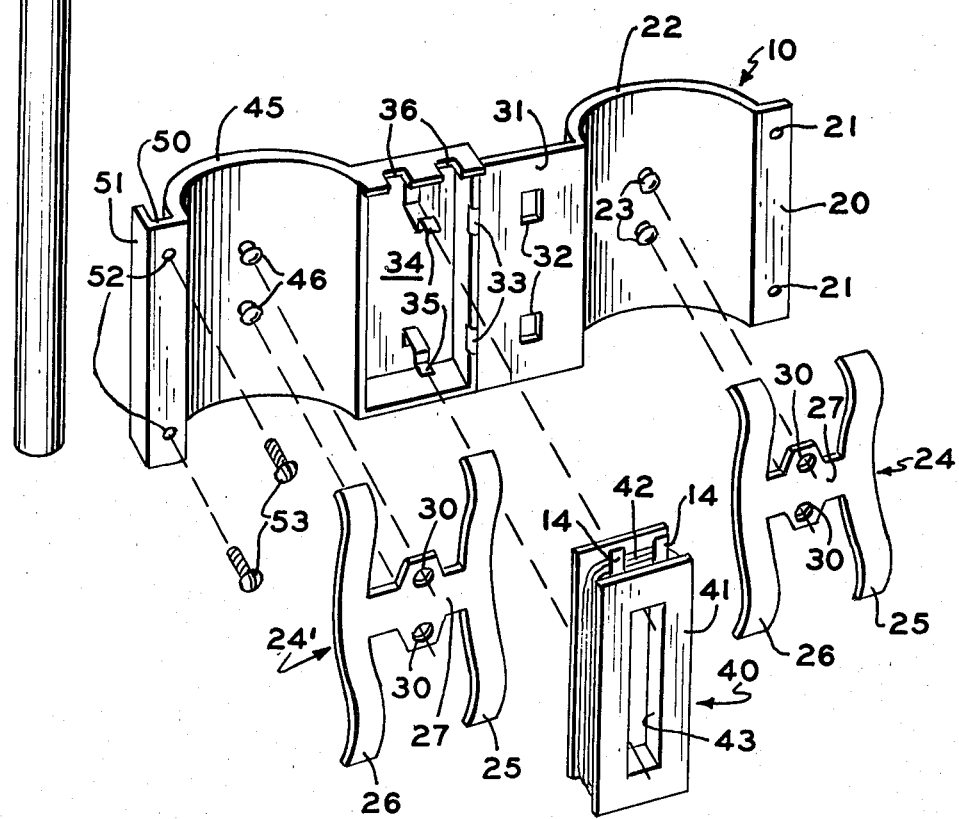
FIG. 2 is an exploded view of the device showing its structure.

In FIG. 2 an exploded view of the device disclosed in FIG. 1 is provided showing in detail all of the novel structure. The housing means 10 is again disclosed in an opened form. The housing means 10 is preferably fabricated by molding the housing as a single piece from a plastic, such as polypropylene. The housing means 10 will now be described in detail. The housing means 10 has a beginning flange 20 that include a pair of holes 21 and these holes are used as part of the retaining means to keep the housing means 10 in an assembled and clamped relationship around the conductor 11, as will be seen. The housing means 10 has a first curve portion 22 which has molded into it projections 23 that are used as a mounting means for a first resilient guide means 24. The resilient guide means 24 is an H-shaped molded piece having two legs 25 and 26 that are integrally connected together at 27 by a mid-joining member. The mid-joining member 27 further has a pair of holes 30 that are spaced to mount the resilient guide means 24 in a frictional or snap engagement over the projections 23.

The housing portion 22 further integrally extends to a cover portion 31 that is a flat molded portion of the housing means 10. The cover means or cover portion 31 has a pair of holes 32, the purpose of which will be described subsequently. The flange 20, the molded portion 22, and the cover portion 31 form a fairly rigid half of the nonmagnetic housing means 10 for the present device. Along an edge 33 of the cover portion 31 there is a molded in hinge member. The hinge member 33 attaches to a recessed portion 34 that is in the form of a boxlike member having a pair of projections 35 and a pair of openings 36. The recessed portion 34 acts as a housing for a pickup means disclosed at 40. The pickup means 40 is formed of a nomagnetic molded bobbin 41 which has a coil 42 wound thereon. The coil 42 is terminated at the pair of terminals 14. The bobbin 41 has a central opening 43 that, when assembled into the recessed portion 34, allows the projections 35 to mount the pickup means 40 within the recessed portion 34 with the terminals 14 projecting from the openings 36. It will be understood that any convenient way of mounting the bobbin 41 of the pickup means 40 in the recessed portion 34 could be used, but the use of the projections 35 through the openings 43 forms a very convenient and inexpensive mounting technique. The only essential point is that the pickup means 40 be retained within the recessed portion 34 with the terminals 14 projecting so that they can be connected to an electric circuit to measure the voltage generated in the coil 42.

The recessed portion 34 is attached to a rigid half circle member 45 which has a pair of projections 46 molded thereto. The projections 46 are connected to a second resilient guide means disclosed at 24′. The second resilient guide means 24′ is fabricated to be identical to the first resilient guide means 24 disclosed. Once again legs 25 and 26 are provided along with a mid-joining member 27, and the holes 30 to allow the mounting of the second resilient guide means 24′0 over the projections 46 to retain them within the housing means 10.

A housing means 10 is completed by a second flange 50 that has a thickened section 51 into which a pair of holes 52 are provided. The holes 52 provide a mounting means for a pair of nonmagnetic, stainless steel screws disclosed at 53. When the present device is assembled and is folded at the hinge member 33. the holes 21 in the edge 20 align with the holes 52 of the thickened section 51. The device is held in assembly by the stainless steel screws 53, as can be seen in FIG. 1. Any type of retainer means can be used to hold the portions 20 and 50 into engagement, and the use of stainless steel screws has been used as an example. This assembly could be accomplished by retainer springs or clamp, as well as by the screws.

When the device of FIG. 2 has been simply assembled by snapping the resilient guide means 24 and 24′ into the housing means 10 at the projections 23 and 46, along with the mounting of the pickup means 40 into the recessed portion 34, the self-centering current responsive pickup means 10 is ready for assembly to a conductor such as disclosed at 11. The assembly consists of merely folding the housing at the hinged portion 33 and assembling the screws 53 into the holes 52. The legs 25 and 26 of the resilient guide means 24 and 24′ resiliently mount and center the device around the conductor 11. With the present device no magnetic circuitry has been required, the device automatically self-centers itself on various size conductors, and the device does not require cutting into the conductor 11 in order to sense and pickup the current flow therein. The self-centering action always keeps the distance from the center of the conductor 11 to the pickup coil 40 the same. This ensures that each unit used has the same characteristics and helps avoid the need for calibration of the units after installation.

The present device can be conveniently assembled at a very economical cost, and can be provided for a wide range of conductor sizes. The device is useable as a current pickup in monitoring of current, control of electric current for energy control purposes, or any other current sensing application.

The applicants have disclosed a very simple and inexpensive structure to provide a current responsive pickup means that is easily installed in the field at a low cost. Various modifications to the structure have been specifically described in the body of the disclosure and it should be understood that the applicants wish to be limited in the scope of their invention solely by the scope of the appended claims.

The embodiments of the invention in which an exclusive property or right is claimed are defined as follows:

1. A current responsive pickup means adapted to be resiliently mounted on a conductor carrying an electric current to sense said electric current, inclding: nonmagnetic housing means with said housing means being capable of encircling said conductor; said housing means including a recessed portion and a cover portion with said portions forming a pickup means mounting chamber with said cover portion closing over said recessed portion when said housing means encircles said conductor; a pair of resilient guide means mounted on said housing means with said pair of guide means displaced from each other so that upon said housing means being closed around said conductor said pair of resilient guide means mounting said housing means resiliently upon said conductor by said resilient guide means being compressed by said housing means against said conductor; a bobbin having a pickup coil wound upon said bobbin to form said pickup means; said pickup means placed in said pickup means mounting chamber prior to said housing means being closed around said conductor; and retainer means attaching opposite ends of said housing means in engagement to resiliently hold said housing means to said conductor with said pickup coil in proximity to said conductor to sense the presence of current in said conductor.

2. A current responsive pickup means as described in claim 1 wherein said housing means is formed from a single piece of nonmagnetic material.

3. A current responsive pickup means as described in claim 2 wherein said single piece of nonmagnetic material is a molded plastic.

4. A current responsive pickup means as described in claim 3 wherein said recessed portion and said cover portion have a common edge with said common edge acting as a hinge when said housing means is closed about said conductor.

5. A current responsive pickup means as described in claim 4 wherein said housing means includes molded projections to mount said bobbin means and said pair of resilient guide means.

6. A current responsive pickup means as described in claim 5 wherein said pair of resilient guide means each is formed from a nonmagnetic plastic; each of said guide means having a pair of legs and a mid-joining member with said guide means being H-shaped; and said mid-joining member having an opening therein to mount said guide means to said housing means with said pair of guide means providing four legs to resiliently mount said pickup means to said conductor to thereby provide a consistent centering of said pickup means with said conductor.

7. A current responsive pickup means as described in claim 6 wherein said bobbin is a molded, nonmagnetic coil holder to hold said pickup coil.

8. A current responsive pickup means as described in claim 7 wherein said bobbin includes electric terminals to which said pickup coil is attached, and by which said current responsive pickup means is adapted to be connected to current measuring circuitry.

9. A current responsive pickup means as described in claim 8 wherein said pair of H-shaped guide means are molded plastic with said guide means having their legs and their mid-joining members molded as a single piece.

10. A current responsive pickup means as described in claim 1 wherein said pair of resilient guide means each is formed from a nonmagnetic plastic; each of said guide means having a pair of legs and a mid-joining member with said guide means being H-shaped; and said mid-joining member having an opening therein to mount said guide means to said housing means with said pair of guide means providing four legs to resiliently mount said pickup means to said conductor to thereby provide a consistent centering of said pickup means with said conductor.

* * * * *